United States Patent
Moslehi (10) Patent No.: US 6,245,655 B1
(45) Date of Patent: Jun. 12, 2001

(54) METHOD FOR PLANARIZED DEPOSITION OF A MATERIAL

(75) Inventor: Mehrdad M. Moslehi, Los Altos, CA (US)

(73) Assignee: CVC Products, Inc., Rochester, NY (US)

( * ) Notice: Subject to any disclaimer, the term of this patent is extended or adjusted under 35 U.S.C. 154(b) by 0 days.

(21) Appl. No.: 09/285,162

(22) Filed: Apr. 1, 1999

(51) Int. Cl.$^7$ .................................................. H01L 21/44
(52) U.S. Cl. ........................... 438/612; 438/687; 438/677
(58) Field of Search ................................... 438/687, 681, 438/674, 677, 641

(56) References Cited

U.S. PATENT DOCUMENTS

| 4,792,378 | 12/1988 | Rose et al. ............................ 156/643 |
| 4,825,809 | 5/1989 | Mieno .................................... 118/725 |
| 4,948,623 | 8/1990 | Beach et al. ............................ 427/35 |
| 4,970,093 | 11/1990 | Sievers et al. ........................ 427/38 |
| 5,082,542 | 1/1992 | Moslehi et al. ................. 204/192.32 |
| 5,085,731 | 2/1992 | Norman et al. ...................... 156/646 |
| 5,098,516 | 3/1992 | Norman et al. ...................... 156/666 |
| 5,112,448 | 5/1992 | Chakravorty ......................... 205/118 |
| 5,201,995 | 4/1993 | Reisman et al. ..................... 156/646 |
| 5,231,751 | 8/1993 | Sachdev et al. ........................ 29/852 |
| 5,268,034 | 12/1993 | Vukelic ................................. 118/719 |
| 5,312,509 | 5/1994 | Eschbach ............................. 156/345 |

(List continued on next page.)

FOREIGN PATENT DOCUMENTS

| 0 093 971A2 | 4/1983 | (EP) | ............................ H01L/29/40 |
| 0 297 348 | 1/1989 | (EP) | ............................ C23C/16/18 |
| 0448276A2 | 9/1991 | (EP) | ............................ H01L/21/60 |
| 0698918 A1 | 2/1996 | (EP) | ............................ H01L/21/3205 |
| 0 725 439 A2 | 8/1996 | (EP) | ............................ H01L/23/532 |
| 0805489 A2 | 11/1997 | (EP) | ............................ H01L/21/768 |
| 0851482 A2 | 7/1998 | (EP) | ............................ H01L/21/768 |
| 0 881 673 A2 | 12/1998 | (EP) | ............................ H01L/21/768 |
| 02143529 | 1/1990 | (JP) | ............................ H01L/21/3205 |

OTHER PUBLICATIONS

English Language Translation of Abstract from Japanese Patent No. 10092977; Class H01L 23/Subclass 14, Apr. 10, 1998.

(List continued on next page.)

Primary Examiner—Matthew Smith
Assistant Examiner—Renzo N. Rocchegiani
(74) Attorney, Agent, or Firm—Baker Botts L.L.P.

(57) ABSTRACT

A method for selective deposition of a material, such as copper, to form planarized inlaid device interconnect structures, the method suppressing deposition of the material at other than the defined interconnect inlaid metal line trenches and via plug holes. Once a formation is filled with metallization material, deposition is automatically ceased in situ to form a globally planarized interconnect structure. In one embodiment, a blocking agent layer inhibits material nucleation and deposition at the substrate surface plane until the formation is filled, and then flows over the filled inlaid metallization structure to cease further material deposition and to form a globally planarized surface without a need for chemical-mechanical polishing of the metallization material. In another embodiment, an enhancement agent is provided within formations to reduce material nucleation time, resulting in selective deposition of the material proximate to the enhancement agent layer within trenches and holes. A nucleation suppressing agent can be included in the deposition ambient to increase nucleation delay and to suppress material deposition over the patterned field regions and on the formation sidewalls, thus limiting material deposition to within the trenches or holes from the bottom upward. Placement of the enhancement agent layer at the bottom of a device formation features promotes material deposition from the bottoms of the formation features up towards the substrate field surface plane, resulting in improved void-free filling of the via holes and trenches with large-grain inlaid metal for globally planarized interconnect fabrication.

25 Claims, 5 Drawing Sheets

U.S. PATENT DOCUMENTS

| | | | |
|---|---|---|---|
| 5,316,972 | * 5/1994 | Mikoshiba et al. | 437/187 |
| 5,354,712 | 10/1994 | Ho et al. | 437/195 |
| 5,358,743 | 10/1994 | Hampden-Smith et al. | 427/282 |
| 5,418,187 | 5/1995 | Miyanaga et al. | 437/194 |
| 5,453,124 | 9/1995 | Moshehi et al. | 118/715 |
| 5,464,656 | 11/1995 | Verkade | 427/248.1 |
| 5,589,425 | 12/1996 | Hoshino et al. | 427/250 |
| 5,595,606 | 1/1997 | Fujikawa et al. | 118/725 |
| 5,624,498 | 4/1997 | Lee et al. | 118/715 |
| 5,654,245 | 8/1997 | Allen | 438/629 |
| 5,674,787 | 10/1997 | Zhao et al. | 437/230 |
| 5,723,028 | 3/1998 | Poris | 204/231 |
| 5,730,801 | 3/1998 | Tepman et al. | 118/719 |
| 5,736,191 | 4/1998 | Biernath | 427/96 |
| 5,763,953 | 6/1998 | Iijima et al. | 257/762 |
| 5,789,321 | 8/1998 | Ohshita | 438/680 |
| 5,843,516 | 12/1998 | Derbenwick et al. | 427/96 |
| 5,852,088 | 12/1998 | Dismukes et al. | 524/175 |
| 5,866,237 | 2/1999 | Angelopoulos | 428/209 |
| 5,891,348 | 4/1999 | Ye et al. | 216/67 |
| 5,891,513 | 4/2000 | Dubin et al. | 427/98 |
| 5,891,804 | * 4/1999 | Havemann et al. | 438/674 |
| 5,916,359 | 7/1999 | Baum et al. | 106/287.18 |
| 5,948,467 | 9/1999 | Nguyen et al. | 427/99 |
| 6,013,575 | * 4/1999 | Itoh | 438/641 |
| 6,015,917 | 1/2000 | Bhandari et al. | 556/12 |

OTHER PUBLICATIONS

PCT International Search Report for PCT/US99/15583, Apr. 17, 2000.

PCT International Search Report for PCT/US00/08676, Aug. 29, 2000.

Strumm, et al., "Selectivity in low pressure chemical vapor deposition of copper from hexafluoroacetylacetonate–copper(I)–trimethylvinysilane in the presence of water," Materials Science and Engineering, B23 1994, pp. 48–53, Feb. 1994.

Communication relating to the results of the Partial International Search for PUT/US99/15583, Dec. 20, 1999.

Cote, et al. "An Evaluation of Cu Wiring in a Production 64Mb DRAM," IBM Semiconductor Research and Development Center, IBM Microelectronics Division, Hopewell Junction, NY, 1998 Symposium on VLSI Technology Digest of Technical Papers, pp. 24–25, Jun. 1998.

Woo, et al. "A High Performance 3.97 $\mu^2$ CMOS SRAM Technology Using Self–Aligned Local Interconnect and Copper Interconnect Metalization," Networking and Computing Systems Group, Process Technology Development Motorola Inc., Austin, TX, 1998 Symposium on VLSI Technology Digest of Technical Papers, pp. 12–13, Jun. 1998.

Zhao, et al. "Cu/Low–k Dual Damascene Interconnect for High Performance and Low Cost Integrated Circuits" Rockwell Semiconductor Systems, 4311 Jamboree Road, Newport Beach, CA, 1998 Symposium on VLSI Technology Digest of Technical Papers, pp. 28–29, Jun. 1998.

Schulz, et al. "A High–Performance Sub–0.25 $\mu$m CMOS Technology with Multiple Thresholds and Copper Interconnects" IBM Semiconductor Research and Development Center, Hopewell Junction, NY, 1998 Symposium on VLSI Technology Digest of Technical Papers, pp. 18–19, Jun. 1998.

Denning, et al. "An Inlaid CVD Cu Based Integration for Sub 0.25 $\mu$m Technology" Advanced Products Research and Development Laboratory, Motorola, 3501 Ed Bluestein Blvd., Austin, TX, 1998 Symposium on VLSI Technology Digest of Technical Papers, pp. 22–23, Jun. 1998.

English language translation of Abstract from Japanese Patent application No. 10242409; Class H01L 27/Subclass 10, Apr. 30, 1997.

English language translation of Abstract from Japanese Patent Application No. 06203379; Class G11B 5/Subclass 85, Jul. 22, 1994.

English language translation of Abstract from Japanese Patent Application 07057312; Class G11B/Subclass 11, Mar. 3, 1995.

XP000555612 Paranjpe, et al., "Chemical vapor deposition TiN process for contact/via barrier applications" Journal of Vacuum Science and Technology: Part B, U.S., American Institute of Physics, New York, Sep. 1, 1995.

XP000531565 Eizenberg, et al., "Chemical vapor deposited TiCN: A new barrier metallization for submicron via and contact applications," Journal of Vacuum Science and technology: Part A, U.S., American Institute of Physics, New York, May 1, 1995.

PCT International Search Report for PCT/US99/30662, May 23, 2000.

PCT International Search Report for PCT/US00/08676, Nov. 6, 2000.

* cited by examiner

METHOD FOR PLANARIZED DEPOSITION OF A MATERIAL

TECHNICAL FIELD OF THE INVENTION

This invention relates in general to the field of electronic devices, and more particularly to a method for planarized deposition of a material layer for fabrication of an electronic device such as a semiconductor integrated circuit chip.

BACKGROUND OF THE INVENTION

The speed and reliability performance of the leading-edge semiconductor chips fabricated using the 0.25 $\mu\Omega$ technology nodes and beyond is limited by on-chip interconnects. For instance, the maximum clock frequencies of the state-of-the-art microprocessor chips are limited by the on-chip interconnect signal cross-talk and propagation delays due to parasitic elements of the interconnect structure, such as parasitic resistive, capacitive, and inductive elements of the interconnect metallization and dielectric structure. To reduce these parasitic elements and their undesirable effects, industry has turned to alternative materials for forming multi-level interconnects.

The primary approach pursued by the semiconductor industry is to replace conventional interconnect metallization materials, such as aluminum, aluminum alloys and tungsten, with copper due to its higher electrical conductivity (copper resistivity of $\leq 2$ $\mu\Omega\cdot$cm vs. Aluminum alloy resistivity of $\leq 2.7$ $\mu\Omega\cdot$cm). Another approach is to replace the conventional silicon oxide inter-level dielectric (ILD) and inter-metal dielectric (IMD) layers with reduced permittivity or low-k dielectric. These low-k dielectrics generally complicate interconnect process integration due to their inferior thermal stability as well as their electrical, mechanical and thermal conductivity properties compared to silicon dioxide.

Although, over the next several years, copper is expected to become the material of choice for use in most high-performance logic applications, a number of difficulties exist with the deposition and integration of copper. For instance, due to the technological and manufacturing difficulties associated with dry etching of copper, the primary approach for copper deposition to fill inlaid lines and plugs of a substrate formation are the single and dual damascene techniques which eliminate the need for metal etch processes.

Typically, the dual damascene techniques involves two micro lithography patterning steps and two anisotropic dielectric etching steps to form interconnect via holes, for supporting inter-level metal connections, and to form the dielectric trench pattern, for supporting inlaid copper metallization lines. A thin diffusion barrier layer is generally deposited before copper deposition to prevent copper diffusion and poisoning of the silicon devices during the remaining fabrication steps and during the actual chip operation. A copper layer is then generally deposited as a blanket layer covering not only the line trenches and via holes, but also the remainder of the substrate, including the substrate field regions. Chemical-mechanical polishing (CMP) is then used to remove excess copper, polishing back the copper metal to expose the underlying substrate (e.g., field dielectric regions) and to establish the inlaid metal lines and plugs. This process sequence is generally repeated for each interconnect level until the multi-level interconnect fabrication process flow is complete.

Damascene techniques for formation of inlaid metallization structures have a number of disadvantages due to fabrication process complexities. One significant disadvantage is the need for chemical-mechanical polishing (CMP) which is used to polish back and remove excess metal over the field regions to establish a generally flat or globally planarized surface in conjunction with an inlaid metallization structure. Chemical-mechanical polishing, or CMP, increases the cost and complexity of the interconnect fabrication process.

CMP involves the application of mechanical force through pads in the presence of a suitable slurry (typically applied through holes in the pad) to wear down metal deposited on a substrate while the inlaid metal structures are left relatively intact. This process generates slurry wet chemical waste that needs expensive treatment for disposal and requires frequent replacement of consumable pads. The CMP processes may generate and leave additional residual contaminants and particles on the wafers, thus, producing the need for post-CMP wafer cleaning.

Another difficulty with CMP is that it requires extensive process optimization to prevent or minimize problems such as dishing. Unless the CMP process is optimized in order to meet the process integration requirements, it can reduce the overall chip manufacturing yield and increase the chip production costs. Moreover, the CMP processes require relatively expensive (e.g., over $1–2 million) production equipment, resulting in additional increases in the overall semiconductor factory cost. Chemical-mechanical polishing processes are not easily integrated with copper and barrier deposition processes, resulting in increased chip manufacturing cost and production cycle time for fabrication of chips with copper wiring. For instance, the CMP-based removal rates of tantalum-based barrier materials (such as tantalum and tantalum nitride) are typically much slower than the copper removal rates, resulting in possible metal dishing problems and yield loss. Also, chemical-mechanical polishing is difficult to use with low-k dielectrics.

Another difficulty associated with damascene interconnect techniques relates to the deposition pattern for the copper within a device formation. For instance, copper deposited by chemical-vapor deposition (CVD) for filling of trenches and holes tends to form simultaneously and conformally on the bottom and sides of the formation. This tends to result in a circular grain pattern, and can form a gap or seam within the filling material of the formation due to the convergence of material deposited on the opposite sides of the interconnect trenches and via holes. The smaller grain size of the filling material for a blanket copper fill process and the resulting possible voids or seams can result in manufacturing yield loss and interconnect reliability degradations.

SUMMARY OF THE INVENTION

Therefore, a need has arisen for a fabrication method which enables materials deposition on a substrate with patterned device formations to establish a globally planarized surface.

A further need exists for a method which deposits material in substrate formations to form inlaid structures with minimal or no need for chemical-mechanical polishing of the substrate surface after deposition of the material.

A further need exists for a method which deposits inlaid planarized copper metallization structures without a need for metal etch.

A further need exists for a method which deposits material in substrate formations to form inlaid structures with minimal wafer handling, wafer process time, and waste product generation.

A further need exists for a method which deposits material in substrate formations to form inlaid structures with relatively large and uniform grains, and no embedded gaps or voids.

A further need exists for a method which supports interconnect fabrication that is compatible with interconnect process flows comprising low-k dielectric materials or free-space dielectrics.

A further need exists for a method which supports formation of copper interconnects without the need for a barrier layer encapsulating the interconnect plugs and lines.

In accordance with the present invention a method for deposition of a material to achieve a globally planarized surface and inlaid structures is provided that substantially reduces disadvantages and problems associated with previously developed methods for material deposition. Globally planarized deposition of a material is accomplished by allowing deposition of the material in the formations of a substrate and suppressing deposition of the material at the substrate surface plane or top field regions. Globally planarized deposition of copper material in a substrate formation enables formation of inlaid copper structures without a need for chemical mechanical polishing or metal etch processes.

In one embodiment, deposition of the material on the substrate surface plane is suppressed by adding a nucleation suppressing agent to the process gas used for depositing the material, while deposition of the material within the substrate formations is enhanced with a pre-deposited enhancing agent. A pre-deposited blocking agent formed over the field plane or surface plane may be used instead of, or in addition to, the nucleation suppressing agent added to the process gas in order to suppress deposition of the material on the substrate surface or field surface plane.

More specifically, a substrate having patterned formations, such as metal line trenches and via plug holes, is exposed to a reactive process gas for chemical-vapor deposition of a material from the process gas to the substrate. The process gas deposits the material at a predetermined deposition rate after the passage of an incubation time, meaning the time delay before the onset of material nucleation and deposition by the process gas on the substrate. The incubation time relates to the time needed for the reactive process gas to initiate nucleation and continuous coverage of the material on the substrate. A nucleation enhancement agent deposited within the formation reduces incubation time for process gas to initiate nucleation and deposition of the material proximate to or on top of the enhancement agent. Thus, the enhancement agent promotes initial material nucleation and subsequent deposition within the formation up to the surface plane (or field plane) of the substrate.

A nucleation suppressing agent, such as a reactive gas additive, is provided with the process gas to increase the incubation time of the material nucleation associated with the process gas that interacts with the substrate surface plane or the substrate field region. The suppressing agent significantly prolongs the incubation time or eliminates nucleation of the material on the substrate surface plane. Also, the pre-deposited blocking agent formed over the field plane or substrate surface plane may be used either instead or in addition to the nucleation suppressing agent added to the process gas in order to suppress deposition of material on the substrate field surface. Once the formation is filled with the inlaid material, process gas flow is ceased to stop deposition of the material leaving a globally planarized surface of the substrate along with the inlaid material structure.

In another embodiment, the enhancement agent is preferentially deposited on the bottoms but not the sidewalls of the formations of the substrate. Process gas proximate to the enhancement agent has substantially no incubation time or very short nucleation delay, resulting in essentially rapid nucleation and subsequent deposition of the material on the enhancement agent from the bottom of the formation upwards. The lack of enhancement agent on the sidewalls of the formation limits the deposition of the material on the sidewalls, resulting in a bottom-up or upward deposition pattern. To support deposition of copper in the formation, the enhancement agent can be a copper or platinum (or an alloy containing platinum and/or copper) seed layer deposited on the bottom of the formation. The suppression agent can be any copper etching process gas, such as chlorine-containing gasses.

In another embodiment, deposition of the material on the substrate surface plane or substrate field plane is suppressed by a blocking agent deposited on the substrate surface plane. For instance, solder (e.g., tin-containing alloy) deposited on the substrate surface plane adjacent to the formation prevents deposition of material (e.g., copper by metal-organic chemical-vapor deposition) from the process gas onto the substrate surface plane. At typical MOCVD deposition temperatures for copper (i.e., 180° to 250° C.), solder will maintain a liquid state on the substrate surface plane. Deposition of an adhesion promotion layer such as a chromium layer on the substrate surface plane beneath the solder will help maintain the solder's film continuity through sufficient interface adhesion when the solder film is in either solid or liquid state.

As the material (e.g., copper) deposited in the formation fills the formation and reaches the substrate surface or field plane, the top surface of the material deposited in the formation comes into contact with the sidewall edge of the liquid solder layer surrounding the formation feature. Due to the excellent wettability of the deposited material by liquid solder and the surface tension of the molten liquid solder film, the liquid solder rapidly flows over the surface of the formation material and forms a planarized continuous film, blocking further deposition of material in the formation. Once the material reaches the substrate surface plane and the patterned solder film forms a continuous blanket film over the substrate surface, the solder film can then be removed through a simple selective etch process, leaving behind a globally planar substrate surface plane with inlaid material formations, such as inlaid copper metallization structures. The above-mentioned method also works well even with formations comprising variable height features (e.g., shorter metal line trenches and taller via plug holes for copper metallization) since the formation material filling process is a self-limiting process.

The present invention provides many technical advantages. One important technical advantage is the deposition of a material in device formations on a globally planarized substrate surface to form inlaid structures. Deposition of the material in the formation to form inlaid structures without additional deposition on the substrate surface eliminates or reduces the need for chemical-mechanical polishing. Thus, by depositing material on a globally planarized substrate surface, the present invention reduces chip manufacturing cost and complexity, resulting in increased yield and decreased manufacturing waste disposal problems. Further, the present invention supports formation of copper metallization within a device formation without a need for metal etch.

Another important technical advantage of the present invention is the improved material microstructure (e.g., large-grain metallization) due to material deposition from the bottom of the formation upward towards the substrate surface plane. Reduced material nucleation and deposition along the sidewalls of the formation allows void-free filling of material in the formation with larger grain size, improved metallization reliability.

Another important technical advantage of the present invention is compatibility with integration of various low-k dielectrics. For instance, the present invention supports copper metallization formation within low-k dielectric formations without a need for chemical-mechanical polishing. Further, the present invention is compatible with free-space dielectrics, and allows direct interlevel copper-to-copper contacts between interconnect plugs and lines without the use of a diffusion barrier, resulting in improved interconnect performance and reduced chip production costs.

BRIEF DESCRIPTION OF THE DRAWINGS

A more complete understanding of the present invention and advantages thereof may be acquired by referring to the following description taken in conjunction with accompanying drawings in which like reference numbers indicate like features.

DETAILED DESCRIPTION OF THE INVENTION

Preferred embodiments of the present invention are illustrated in the FIGURES, like numeral being used to refer to like and corresponding parts of the various drawings.

Damascene techniques for copper deposition support the fabrication of inlaid copper interconnect lines and plugs within substrate formations. However, the reliance of damascene techniques on chemical-mechanical polishing to form the inlaid metallization structures and a globally planarized substrate surface plane after deposition of copper presents a number of disadvantages. The present invention advantageously supports fabrication of high-performance inlaid interconnect (e.g., copper metallization) structures by depositing material in substrate formations along a globally planarized substrate field surface. Globally planarized deposition without material deposition on the field regions eliminates or substantially reduces the need for chemical-mechanical polishing by suppressing deposition of material on or above the substrate surface plane. Although described herein as forming inlaid copper interconnects, the present invention will support deposition of other interconnect metallization materials, such as aluminum, gold, silver, and superconducting metallization materials. Further, the present invention will support deposition with conventional dielectric materials, low-k dielectric materials, and free-space interconnect dielectrics.

Figure 1:
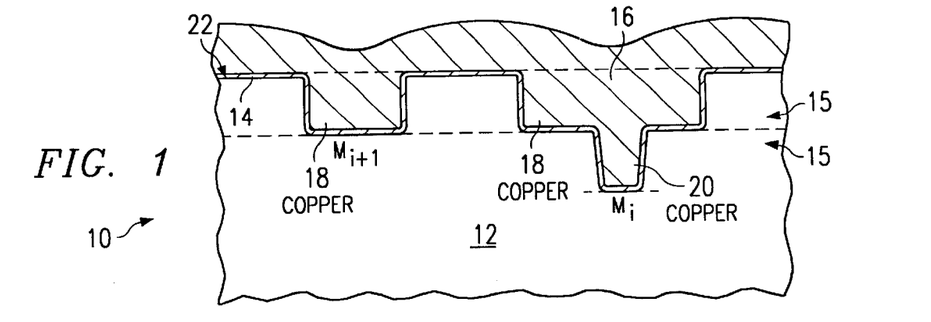
FIG. 1 depicts a side cutaway view of a substrate with inlaid metal line and via plug formations.

Referring now to FIG. 1, some of the difficulties associated with obtaining a globally planarized substrate surface plane with chemical-mechanical polishing are apparent. A side cutaway view of a device 10 depicts a substrate 12, such as a semiconductor substrate comprised of silicon, having a diffusion barrier layer 14 and a copper layer 16 deposited upon it. Formations or patterned features established in device 10 include inlaid lines 18 and an inlaid plug 20 formed within inter-metal/inter-level dielectric medium 15 in substrate 12. Copper layer 16 has been deposited to form inlaid metal lines 18 and inlaid via plugs 20 within dielectric metal trenches and via holes, but has also been deposited above the initial substrate surface plane 22. Known chemical-mechanical polishing (CMP) techniques can preferentially remove copper layer 16 starting from the topmost regions down to substrate surface plane 22 to complete formation of inlaid metal lines 18 and inlaid via plugs 20, without any substantial removal of the inlaid copper lines and plugs below the surface plane 22.

Figure 2:
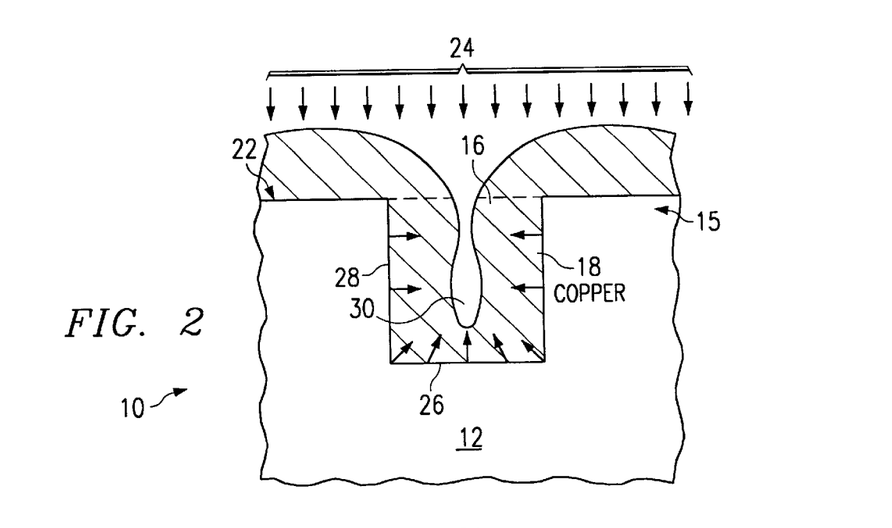
FIG. 2 depicts a side cutaway view of an inlaid line formation having blanket material deposition from the bottom and sidewalls of the formation.

Referring now to FIG. 2, a side cutaway view of a damascene trench formation 18 formed within dielectric medium 15 in substrate 12 is depicted with a copper layer 16 partially deposited in formation 18 using a blanket deposition process. A precursor process gas 24, such as a chemical-vapor deposition precursor gas (e.g., CupraSelect for MOCVD copper), flows over substrate 12 to deposit copper within formation 18 below surface plane 22 and on the field surface of substrate 12 above original surface plane 22. Precursor process gas flow 24 deposits copper simultaneously and relatively conformally on bottom surface 26 and sidewall surface 28 of formation 18 as well as on field surface region 22. As copper deposits on sidewall surface 28 a reducing width gap 30 forms in the central region of formation 18. Copper deposited on sidewall surface 28 reduces precursor process gas flow 24 and reactant transport to within gap 30 and may close gap 30 near the top surface plane 22, resulting in a permanent void within formation 18. As depicted by the arrows projecting from bottom surface 26 and sidewall surface 28, copper material deposition within formation 18 proceeds on all surface, surrounding the central region and gap 30. If gap 30 results in a permanent void, it reduces the electrical conductance of the inlaid copper line formed in formation 18, and may also have detrimental impacts on chip manufacturing yield and interconnect reliability.

Figure 3A:
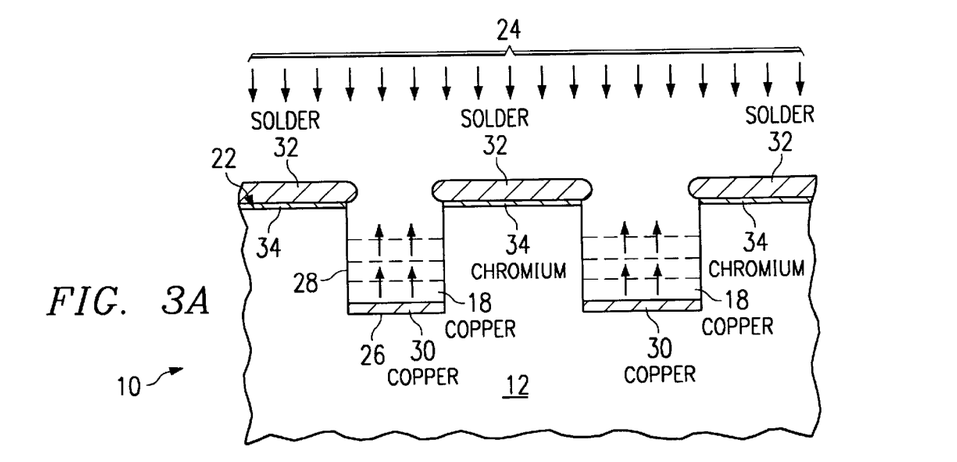
FIG. 3A depicts a side cutaway view of inlaid line formations in a substrate having selective material deposition from an enhancement agent located on the bottom of the formation.

The present invention provides for uniform void-free material deposition within substrate formations or inlaid trenches and holes, and also suppresses or eliminates material deposition above the substrate surface plane to achieve fabrication of inlaid metallization or wiring structures with a globally planarized surface without a need for a CMP fabrication process. Referring now to FIG. 3A, a side cutaway view of a substrate 12 is depicted with two formations 18 with different widths. A precursor process gas 24, such as CupraSelect, which is the trade name by Schumacher for CU(I)(hfac)(tmvs), is used for depositing copper within inlaid damascene formations 18. Material nucleation starts from the bottom surface 26, and subsequent copper deposition proceeds upward towards the substrate surface plane 22, resulting in uniform and void-free deposition of inlaid large-grain growth of the copper within the formations 18. An enhancement agent 30 located at the bottom of the formations 18 encourages material nucleation and deposition to occur from the bottom surface 26 of formations 18 before any nucleation or deposition occurs along the sidewalls 28 of formations 18 or the field region of the substrate.

Figure 4:
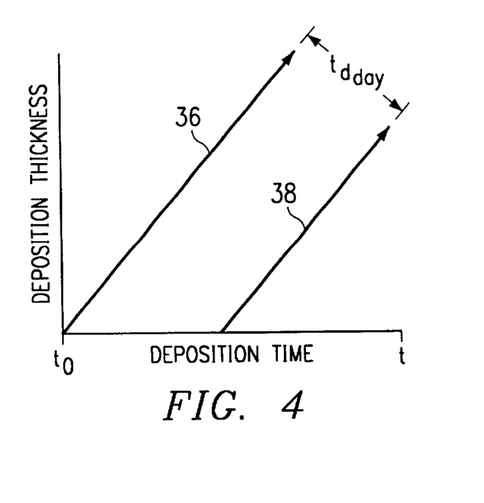
FIG. 4 depicts a graphical representation of incubation time delay on a plot of deposition thickness vs. Deposition time.

The operation of enhancement agent 30 is better understood by reference to FIG. 4, which is a graph showing typical deposition characteristics for conventional chemical-vapor deposition, such as metal-organic chemical-vapor deposition (MOCVD) precursors, such as CupraSelect from Schumacher. The graph depicts material deposition thickness on the Y-axis that occurs for over a time "t" depicted on the X-axis. Line 36 depicts deposition thickness vs time when deposition of material is initiated upon first exposure to a precursor gas without any incubation time or nucleation delay. Line 38 depicts deposition thickness over time when deposition of material is delayed for an incubation time of $t_{delay}$, which represents the nucleation delay associated with the precursor for deposition of material on a typical substrate or diffusion barrier surface. Typically, thermal MOCVD copper processes experience nucleation delay, meaning that, for a given deposition surface and process conditions, a delay occurs between the initial exposure of the substrate to the reactive CVD precursor and initiation of nucleation and deposition of a continuous material later. Enhancement agent 30 provides surface conditions on the bottom of formations 18 that reduce nucleation delay or promote or accelerate material nucleation, resulting in deposition from the bottom surface upwards to the substrate surface plane before any independent nucleation or substantial deposition of the material can occur on sidewalls 28 of formation 18. Enhancement agent 30 can be a thin (e.g., 20 Å to 100 Å) seed layer, such as a copper or platinum seed layer, that reduces the nucleation delay of the precursor gas 24. Other choices of enhancement agents or seed materials are possible, including alloys of copper or platinum which promote copper nucleation with minimal incubation time.

In one embodiment, the dimensions of formations 18, the deposition rate of material later from precursor gas 24 and the $t_{delay}$ between the initiation of deposition for the enhancement agent versus the initiation of deposition for the substrate surface regions not covered with the enhancement agent can be arranged to allow filling of formations 18 with material before any substantial nucleation or deposition of material occurs on the substrate surface. Thus, formations 18 can be filled up to the substrate surface plane 22, resulting in globally planarized inlaid metallization structures without a need for chemical-mechanical polishing or CMP fabrication process. In one embodiment, the nucleation delay for the substrate surface regions not covered with the enhancement agent can be increased by adding a suppressing agent such as a reactive gas to the precursor gas during material deposition. For instance, the addition of an etching gas, such as a chlorine-based gas,(e.g., C12 of HCl) to the precursor (e.g., CupraSelect) will substantially increase the nucleation delay for material nucleation and deposition on the substrate surface regions not covered with the enhancement agent without substantially increasing the material nucleation and deposition on substrate regions covered with the enhancement agent 30. Thus, the addition of a suppressing agent such as an etchant gas addition to the copper deposition process medium effectively increases the incubation time $t_{delay}$ for material nucleation and onset of deposition on the substrate surface regions not covered by an enhancement agent, thus allowing a greater amount of time for the precursor 24 to fill formations 18 before deposition of material begins on the substrate surface, and before any independent secondary material nucleation and deposition occurs on the feature sidewalls.

In another embodiment of the present invention, deposition of copper on the substrate surface plane 22 is suppressed by a blocking agent 32, which covers the substrate surface plane 22 to prevent its exposure to precursor process gas 24. Referring again to FIG. 3, a blocking agent 32 is located on the substrate surface plane 22 to prevent exposure of the original substrate surface to reactive precursor gas 24. For instance, one blocking agent 32 is a layer of tin-alloy solder with a thickness of approximately 5000 angstroms to 2 micrometers deposited on substrate surface plane 22 (e.g., by physical-vapor deposition (PVD)). The solder can include tin, lead, indium, or other conventional solder materials or combination of materials, such as a tin-indium solder. Once formations 18 comprising inlaid trenches and holes are filled with material by precursor gas 24, the blocking agent can be removed, resulting in fabrication of an interconnect structure with a globally planarized substrate surface without a need for a CMP process.

The use of solder as blocking agent 32 provides a number of advantages. First, the tin-containing solder has a relatively large incubation time for copper deposition since tin suppresses copper nucleation and deposition during thermal MOCVD, resulting in minimal or no deposition of copper on a tin-containing solder blocking agent 32. Another advantage of using solder is that a low-melting-point solder melts at typical copper deposition temperatures of approximately 180° to 200° C. for thermal MOCVD copper processes. By placing a thin layer of chromium 34 or other suitable glue/adhesion material between the solder blocking agent 32 and the substrate surface plane 22 (e.g., a thin 100 to 500Å of a glue/adhesion material deposited by PVD), the solder melt layer will maintain its continuous coverage of the top surface 22. An effective adhesion layer prevents break-up and ball-up of the molten solder film during the copper MOCVD process.

Figure 3B:
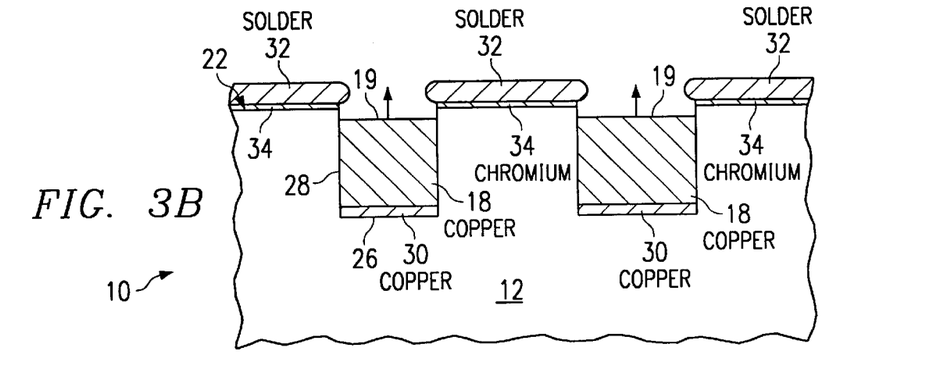
FIG. 3B depicts a side cutaway view of the evolution of an inlaid structure just before the material deposition automatic self-limiting end point via solder flow.
Figure 3C:
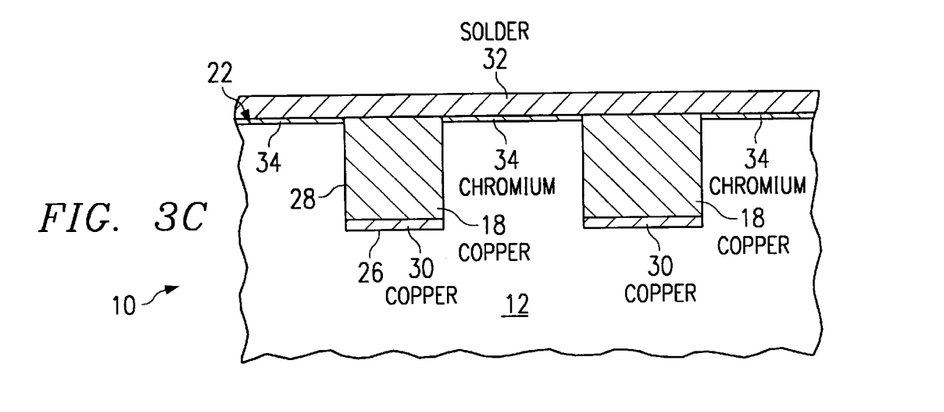
FIG. 3C depicts a side cutaway view of a completed inlaid structure having a solder flow to cease deposition.

FIG. 3B depicts partially-filled formations with the structure deposited in formations 18 up to a level 19 proximate to substrate surface plane 22. Once a formation 18 fills with material and reaches the solder blocking agent 32 at substrate surface plane 22 at the edge of the formation structures, the molten solder layer easily and rapidly flows over the exposed inlaid material surfaces, allowing the solder melt to flow over the material that has filled formation 18 and to form a continuous coverage solder layer, as is depicted in FIG. 3C. The flowing of blocking agent 32 over the material within formation 18 acts as an automatic end pointing way to cease deposition of the material once the material reaches near the substrate surface plane 22, resulting in a globally planarized deposition surface and formation of the inlaid material structures. Further, the self-stopping or automatic process end pointing mechanism offered by the rapid flowing blocking agent promotes even and uniform deposition of material up to substrate surface plane 22. For instance, if deposition takes place over device formations with different trench or hole heights and variable heights of material occur in different formations 18 of substrate 12, the flowing blocking agent ceases deposition on a formation-by-formation basis, allowing completion of deposition of material in formations that have deeper features while preventing filled formations from overshooting substrate surface plane 22. Moreover, the proposed method is tolerant of deposition process non-uniformitively. For instance, if nonuniform material deposition takes place in different formations 18 of substrate 12, the flowing blocking agent endpoint deposition on a formation-by-formation (e.g., trench-by-trench or hole-by-hole) basis, allowing completion of deposition of material in formations that filled formations from excess deposition by capping them with flowing solder.

Figure 5:
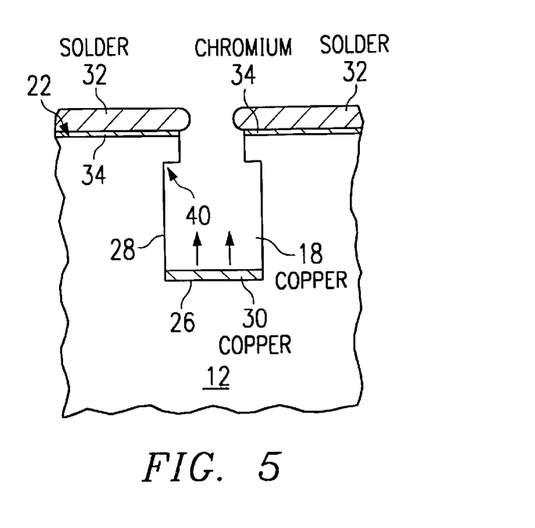
FIG. 5 depicts a side cutaway view of a substrate formation having an overhang to limit sidewall deposition.
Figure 6A:
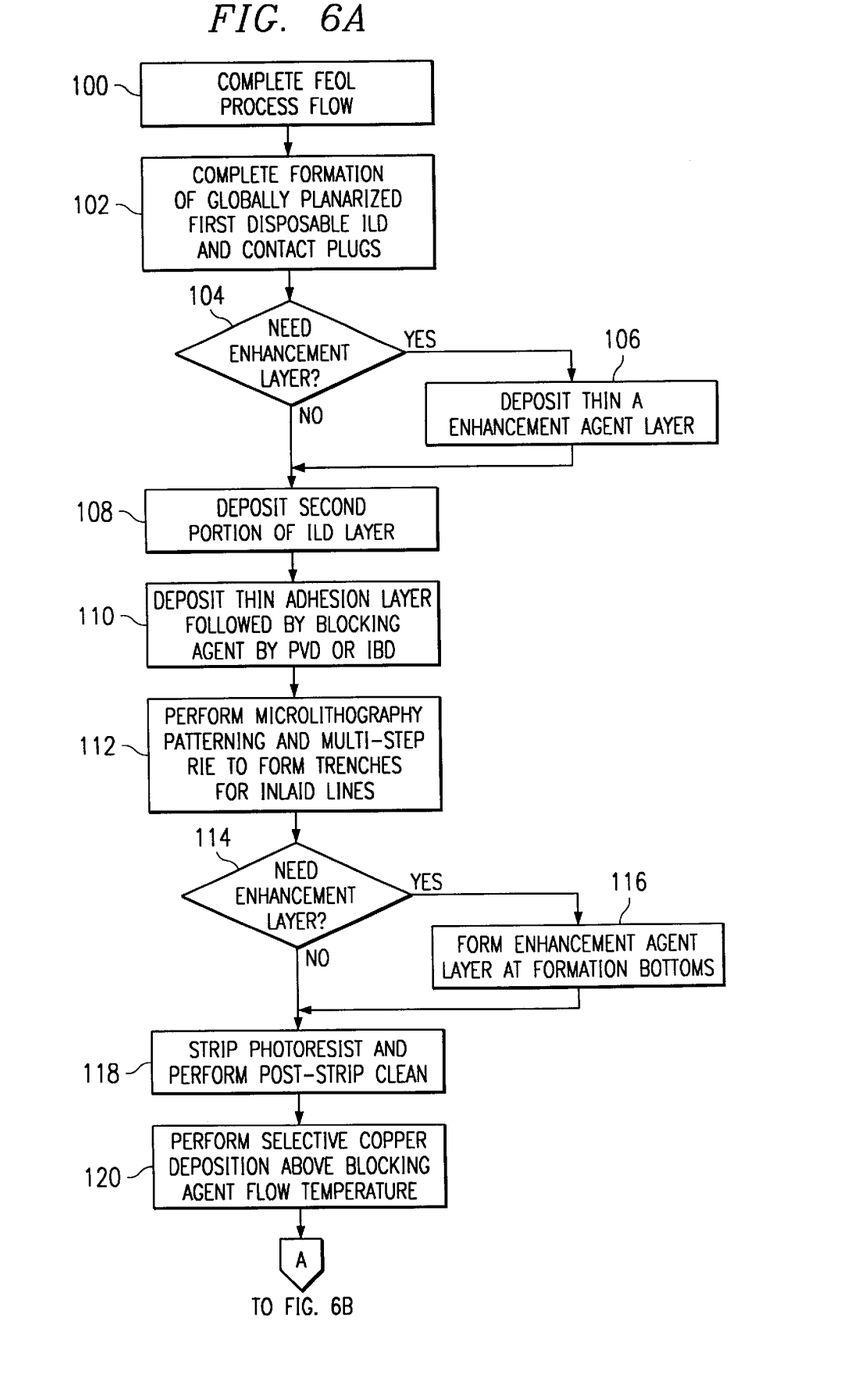
FIGS. 6A, 6B and 6C depict a flow diagram of steps for performing embodiments of the present invention.
Figure 6B:
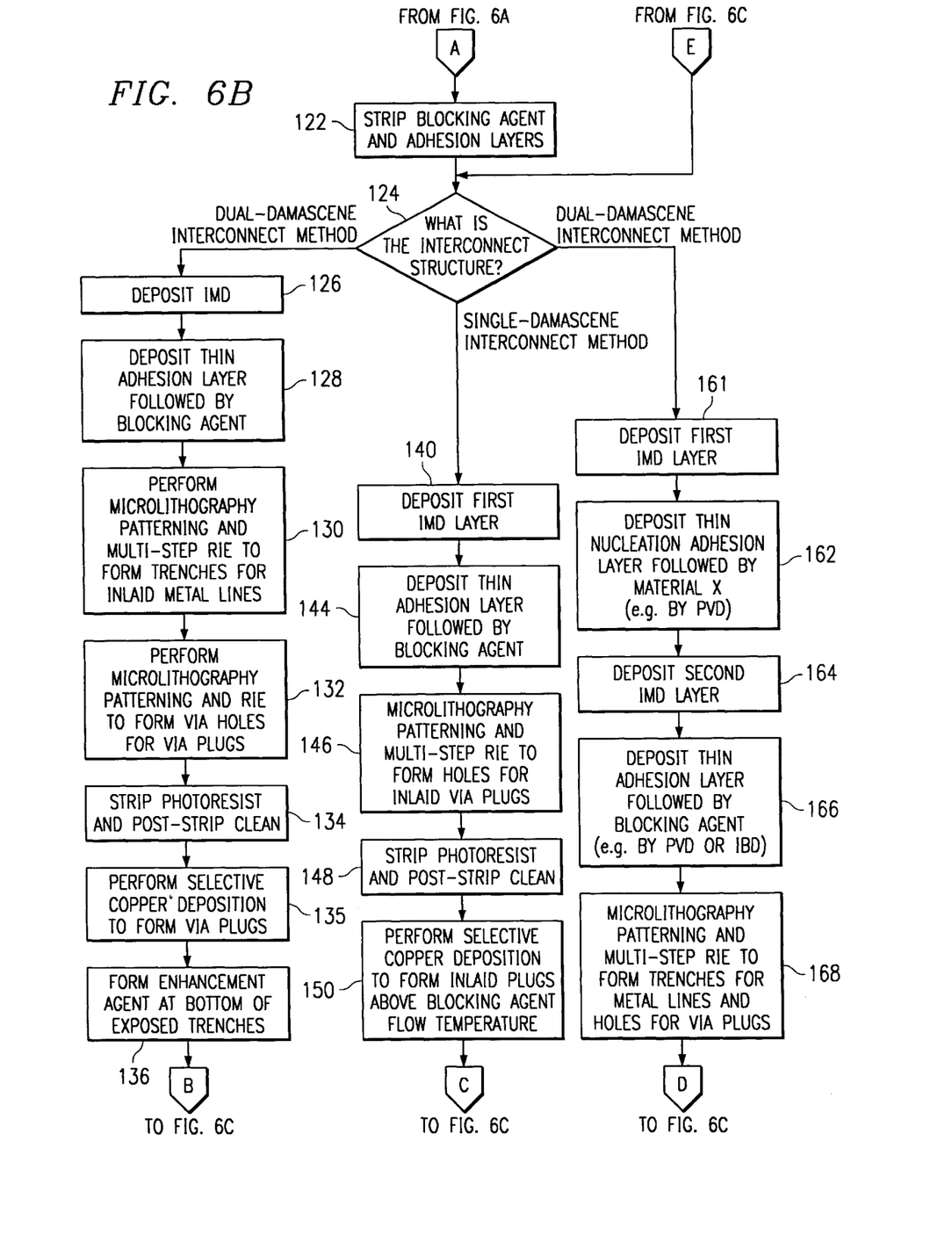
Figure 6C:
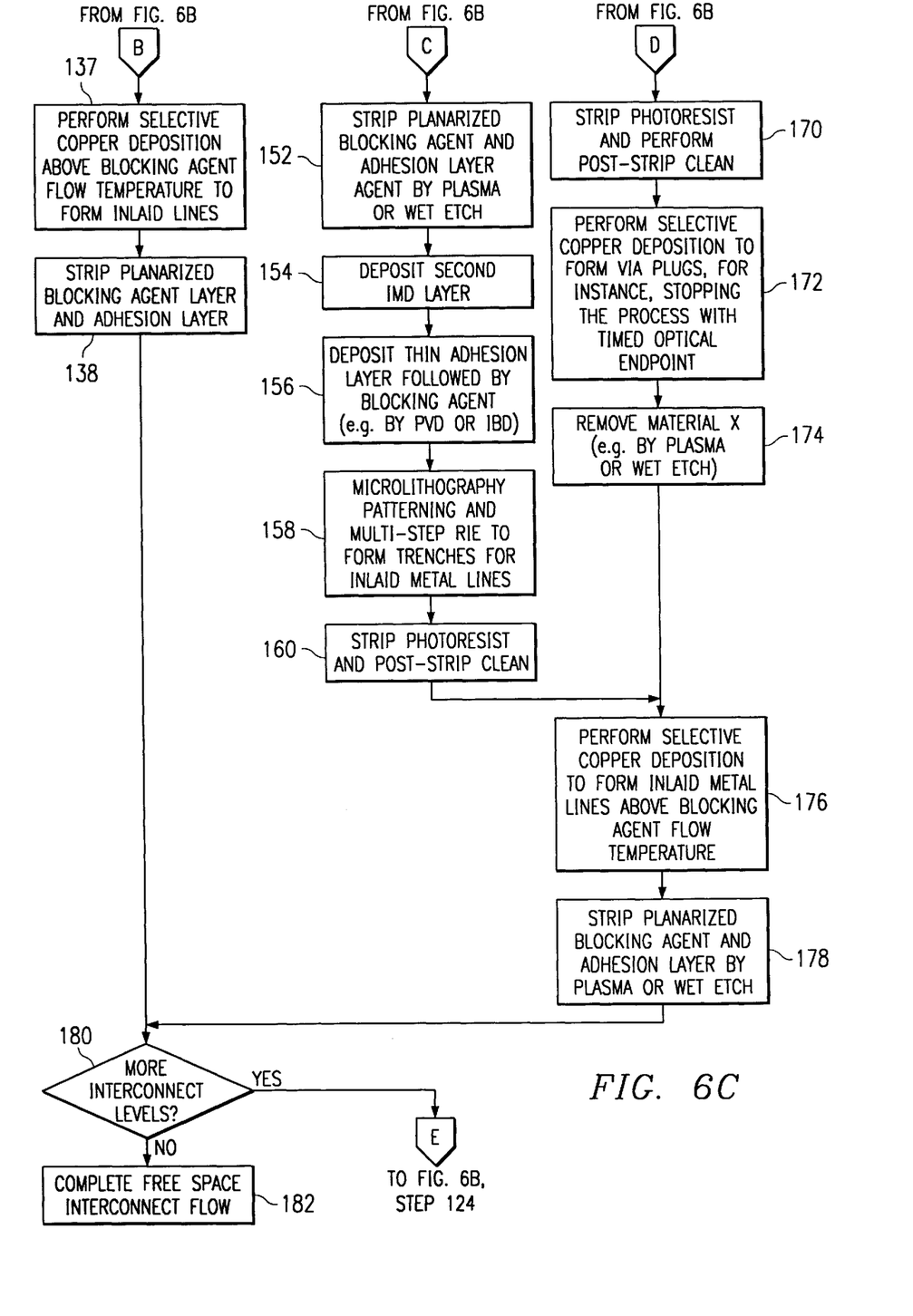

Referring now to FIG. 5, a side cutaway view of a formation 18 is depicted to illustrate one method for establishing an enhancement agent on the bottom surface 26 of formation 18. An overhang 40 is formed at the upper portion of formation 18. Overhang 40 blocks side surfaces 28 of formation 18 from receiving deposition of enhancement agent 30 from above using a directional deposition technique. For instance, collimated physical-vapor deposition (PVD) or ion beam deposition (IBD) of a copper or platinum seed layer (e.g., 20 Å–100Å thick) as an enhancement agent 30 on bottom surface 26 of formation 18 will not result in substantial deposition of copper or platinum on sidewall surface 28 of formation 18, particularly in presence of overhang 40. One advantage of avoiding the presence of enhancement agent 30 on sidewall surface 28 is that deposition of material will preferentially occur from the bottom surface up towards substrate surface plane 22 without substantial deposition of the material along side surface 28. This deposition pattern helps to prevent premature flowing of blocking agent 32 over formation 18, which could occur if material deposited on side surface 28 reaches the substrate surface plane before formation 18 is filled with material. Moreover, this will also promote formation of large-grain inlaid metallization structures. Referring now to FIG. 6, a block diagram depicts major process steps for accomplishing deposition of a material in substrate formations with a globally planarized substrate surface plane and formation of inlaid interconnect structures without a need for CMP. The steps depicted by FIG. 6 illustrate the present invention as applied to globally planarized formation of inlaid material structures in a device with a free-space dielectric medium. The use of a free-space dielectric can eliminate the need for a barrier, as is explained in greater detail by U.S. patent application Ser. No. 09/064,431, entitled "Ultra High-Speed Chip Interconnect Using Free Space Dielectrics," by Moslehi, which is incorporated herein by reference. Advantageously, a device formed with a free-space dielectric and without a barrier allows direct contact between adjacent via plugs and metal lines, without a barrier layer therebetween, resulting in a reduction of the effective via resistance and improved electromigration lifetime, as well as reduced process complexity. However, the present invention also supports formation of inlaid interconnect structures in patterned device formations with barrier layers between the dielectric formations and copper wiring lines and plugs. Thus, to provide for interconnect fabrication with barriers, the steps depicted below could be modified slightly to include steps for deposition of barrier materials as needed.

The process begins at step 100 with completion of the front-end-of-the-line fabrication process flow for transistors, isolation regions, and other front-end devices over the substrate. At step 102, formation of the globally planarized first disposable inter-level dielectric (ILD) such as silicon dioxide or amorphous silicon and contact plugs is completed with conventional metallization materials, such as tungsten or aluminum, etc. A disposable ILD layer is wed in conjunction with fabrication of an interconnect structure comprising free space inter-metal dielectric (IMD) medium within the final chip structure. While the process flow presented herein is for interconnect with free space ILD/IMD, alternative ILD and IMD materials may also be used, including low-k dielectrics.

At step 104, a decision is made whether to deposit an enhancement agent layer for enhancing nucleation of a material layer at a subsequent deposition step over the first disposable ILD. For instance, a thin seed layer of CrCoPt of approximately 20 to 100 angstroms thickness deposited by physical-vapor deposition (PVD) or ion-beam deposition (IBD) may be deposited at step 104 to enhance subsequent deposition of copper. At step 108, the second portion of ILD is deposited, such as a disposable layer of silicon dioxide, amorphous silicon, or other conventional material, using PVD, IBD, CVD, or PECVD. At step 110, a thin wetting adhesion layer, such as Cr, Co, or CrCoPt, is deposited with PVD or IBD, followed by deposition of a blocking agent, such as tin-alloy or other solder having a thickness of between approximately 5000 angstroms to 3 micrometers. The blocking agent will suppress nucleation and deposition of metallization material layer during a subsequent CVD step. At step 112, microlithography patterning is performed followed by multi-step relative-ion etch (RIE) to form trench structure formations for inlaid metal lines (for the first level metal. At step 114, a decision is made whether to form an enhancement layer at the bottom of the trench formations, such as a copper or platinum or CrCoPt layer formed by collimated PVD or IBD and etch back. Note that, whether the enhancement layer at the bottom of the trench is formed at step 106 or at step 116, the result is a trench formation with an enhancement layer that is prepared to accept copper deposition during a subsequent CVD step. At step 118, the photoresist used for microlithography is stripped and post-strip clean is performed.

At step 120, selective copper deposition is performed to fill the trench formations from the trench bottoms upwards. For instance, metal organic chemical-vapor deposition (MOCVD) of copper with a precursor such as Schumaker's CupraSelect with Cu(I)(hfac)(tmvs) chemical structure will selectively deposit copper in the formations from the trench bottom towards the top. Copper is inhibited from deposition on the tin-blocking agent, and is deposited in an enhanced fashion with minimal or essentially no nucleation delay (near-zero incubation time) from the bottom surface portion of the trench formations with aid from the enhancement agent layer located at the bottom of the trenches. Thermal MOCVD can deposit copper in the temperature range of 180° to 250° C. Once the deposited copper reaches the substrate surface plane, the blocking agent or tin-containing solder film, which is maintained in a molten liquid state at the deposition temperature during the MOCVD process, flows over the filled formations (due to excellent wettability of copper by solder), effectively ceasing deposition of copper resulting in formation of a globally planarized interconnect structure and forming the well-defined inlaid copper metallization structures. Once deposition is complete, at step 122, the blocking agent and glue/ adhesion layer are stripped from the substrate by either plasma etch or wet etch. This completes formation of the first level of inlaid damascene interconnect structures.

At step 124, a decision is made on the formation of the interconnect structure of the first inter-metal dielectric. Starting at step 126, a deposition method is performed which mimics the dual damascene deposition technique. At step 126, an inter-metal dielectric is deposited, such as a disposable layer of silicon dioxide or amorphous-silicon using PVD, IBD, CVD, or PECVD. At step 128, a thin (e.g., 50 Å–100Å) adhesion layer, such as Cr, Co, or CrCoPt, is deposited over the inter-metal dielectric by PVD or IBD, followed by deposition of a blocking agent layer, such as tin-containing solder using PVD or IBD. The solder layer thickness may be in the range of approximately 5000 angstroms to 3 micrometers. At step 130, microlithography patterning and multi-step anisotropic RIE process are performed to form trench structure formations for inlaid metal lines. At step 132, microlithogrpahy patterning and multi-step RIE is performed to form the via holes for via plugs. The order of the fabrication processes to form the trenches and holes may also be reversed. At step 134, the photoresist is stripped and post-strip clean is performed. At step 135, a first selective copper deposition process is performed for initial filling of the via holes, and formation of metallization plugs. The via filling process is stopped after the via plugs are formed. Then, at step 136, an enhancement agent is formed at the bottom of the formation trenches, such as by a combination of collimated PVD and subsequent etch back or the enhancement agent material from the blocking agent surface. At step 137, another selective copper deposition process is performed to form inlaid wires within the formation trenches with an MOCVD process temperature above the blocking agent's melting point. The blocking agent will automatically end point the deposition process upon complete formation of the inlaid metallization wires, such as by the flow of molten solder over the structure. Once the line and plug formations are filled during the copper deposition process steps, the blocking agent, such as molten solder, can flow over the inlaid metal lines formations to cease material deposition and to form a globally planarized interconnect structure comprising the embedded interconnect metallization and plugs. At step 138, the blocking agent and adhesion layers are stripped by plasma or wet etching, leaving a completed second level globally planarized interconnect structure with inlaid damascene metallization. At step 180, a decision is made whether additional interconnect levels are needed. The process may repeat for additional interconnect levels with steps 126 through 138 as desired.

At step 124, a decision can be made to form an interconnect structure using steps that mimic formation by a single damascene interconnect fabrication technique in which first and second IMD levels are deposited separately and also the metallization via plugs and metal lines are formed separately. At step 140, the first IMD layer is deposited, such as a disposable layer of silicon dioxide or amorphous silicon deposited using PVD, IBD, CVD or PECVD. At step 144, the thin adhesion layer and blocking agent layer are deposited as described above. At step 146, microlithography patterning and multi-step RIE processes are performed to form holes for inlaid via plugs. At step 148, photoresist is stripped and post-strip cleaning is performed. At step 150, selective copper deposition in the presence of the blocking agent layer over the patterned field region is performed to fill the plugs as previously described. At step 152, the blocking agent and adhesion layer are stripped using plasma or wet etch, leaving a globally planarized IMD layer with inlaid interconnect metallization plugs completed.

At step 154, the second portion of the disposable IMD layer is formed by deposition of, for instance, amorphous silicon or silicon dioxide using PVD, IBD or PECVD. Upon completion of the via plugs for intermetal connections and formation of the second IMD layers, at step 156, another thin adhesion layer and blocking agent layer are deposited by PVD or IBD. At step 158, microlithography patterning and multi-step RIE processes are performed to form trenches for subsequent fabrication of inlaid metal wire lines. At step 160, photoresist strip and post-strip clean process steps performed. At step 176, selective copper deposition is performed as previously described to form the inlaid wire lines. Again, the deposition process is automatically stopped when the blocking agent layer flows to cover the planarized surfaces of the inlaid copper lines. At step 178, the blocking agent layer is stripped, leaving a completed globally planarized IMD layer along with planarized inlaid metal lines and plugs.

An alternative dual damascene-type of technique using this invention is shown from step 124 and continuing with deposition of the first portion of the next IMD layer at step 161. At step 162, a thin adhesion and nucleation enhancement agent layer is deposited followed by a nucleation suppressant material X. These layers can be deposited by PVD, IBD or PECVD. Material X is designed to have dielectric characteristics with a different etch rate compared to the ILD material. Thus, if silicon dioxide is used as the disposable IMD and ILD layers, material X can be an amorphous silicon layer. If an amorphous silicon layer is used as the disposable IMD and ILD layers, material X can be silicon dioxide. Again, the nucleation enhancement agent may be CrCoPt or copper. At step 164, the second portion of IMD is deposited as describe before. At step 166, a thin adhesion layer is deposited, followed by a blocking agent, such as a tin-containing solder. At step 168 microlithography patterning and multi-step RIE processes are performed to form the trenches for metal lines, and holes for via plugs. As previously described, this order may be reversed. At step 170, photoresist strip and post-strip clean processes are performed. At step 172, selective copper deposition is performed to form via plugs. The copper deposition process may be performed by thermal MOCVD process using CupraSelect or other suitable precursor. Moreover, the MOCVD process ambient may include an ambient, such as chlorine-containing gas, to further suppress copper nucleation and deposition on the blocking agent layer and on material X. Since material x, for instance silicon dioxide or amorphous silicon, covers the bottom surfaces of trenches, and since material x suppresses copper nucleation or deposition, the plug formation process does not lead to any secondary deposition at the bottom of the trenches. At step 174, material X is selectively removed to expose the underlying nucleation enhancement agent layer at the bottom surface of the trenches and allow completion of deposition of inlaid wire formations at steps 176 and 178. Again, once fabrication of the inlaid interconnect structure is complete, at step 180 a decision is made whether to proceed with fabrication of another interconnect level by returning to step 124. Once all the inlaid metallization levels are fabricated, at step 182 the process can continue to complete a free space dielectric medium fabrication process.

The flow chart depicted by FIG. 6 shows three different embodiments of this invention for forming planarized multi-level interconnect structures. The interconnect process flows depicted herein enable fabrication of multi-level copper metallization structures with free space ILD/IMD medium for the completed chips, with each embodiment having several common features. For instance, the process flows described herein: 1.) Support formation of copper interconnect structures without a need for chemical-mechanical polishing of metal copper; 2.) Support deposition of inlaid metal lines and via plugs formed by selective copper deposition, such as by CVD or MOCVD, through suppression of copper nucleation and deposition at unselected areas; 3.) Reduce the need for a diffusion barrier when used in conjunction with free-space ILD/IMD dielectrics, resulting in reduced via plug to metal line resistance due to the lack of an intermetal barrier; and 4.) Enable metal deposition end pointing by using a combination of selective copper deposition techniques, such as selective thermal MOCVD, and a field patterned, flowable solder alloy which flowably and automatically ceases copper deposition at predetermined planarized levels when deposition temperatures are set above blocking agent layer melting points, such as 180 to 250° C.

Although the present invention has been described in detail it should be understood that various changes, substitutions and alterations can be made hereto without departing from the spirit and scope of the invention as defined by the appending claims.

What is claimed is:

1. A method for depositing a material to fabricate an inlaid structure in a formation of a device, the method comprising the steps of:

depositing a blocking agent on the device field surface proximate to the formation;

depositing the material on the device so that the material substantially fills the formation to form the inlaid structure; and ending deposition of the material in the formation by flowing the blocking agent over the deposited material when the material substantially fills the formation.

2. The method according to claim 1 further comprising the steps of:

depositing an enhancement agent on the bottom surface of the formation; and filling the formation with the material starting from the bottom surface of the formation to the blocking agent.

3. The method according to claim 2 wherein said depositing the material step further comprises the step of suppressing deposition of the material on the side surfaces of the formation so that the material fills the formation starting from the bottom to reach the blocking agent before substantial deposition of the material can occur on the side surfaces.

4. The method according to claim 3 wherein the suppressing step comprises depositing the material in the presence of a suppressing agent.

5. The method according to claim 4 wherein the suppressing agent comprises chlorine.

6. The method according to claim 5 wherein the suppressing agent comprises chlorine-containing gas added to the material deposition process ambient.

7. The method according to claim 1 wherein the material comprises copper.

8. The method according to claim 7 wherein the deposition enhancement agent comprises copper.

9. The method according to claim 7 wherein the deposition enhancement agent comprises platinum.

10. The method according to claim 1 wherein the material comprises silver.

11. The method according to claim 1 wherein the material comprises gold.

12. The method according to claim 1 wherein the material comprises aluminum.

13. The method according to claim 1 wherein the material comprises superconducting material.

14. The method according to claim 1 wherein the blocking agent comprises solder.

15. The method according to claim 14 wherein the solder comprises tin.

16. The method according to claim 14 wherein the solder comprises indium.

17. The method according to claim 14 wherein the solder comprises lead.

18. A method for formation of a substantially planarized inlaid structure in a substrate having patterned formations and a field surface plane using a material deposition process, the method comprising:

exposing the substrate to a reactive deposition process for depositing a filling material in the patterned formations;

suppressing deposition of the filling material at the substrate field surface plane; and ceasing deposition of the filling material when the material fills the patterned formation to near the substrate field surface plane by in situ capping of the inlaid filling material.

19. The method according to claim 18 wherein the reactive deposition process comprises chemical vapor deposition using a reactive precursor for depositing the filling material.

20. The method according to claim 19 wherein the precursor comprises Cu(I)(hfac)(tmvs) and the filling material comprises copper.

21. The method according to claim 18 wherein said suppressing step further comprises depositing and patterning a blocking agent layer on the substrate field surface plane before exposing the substrate to the reactive deposition process.

22. The method according to claim 18 wherein the reactive deposition process has an incubation time associated with the initial material nucleation and deposition on the substrate, and a finite deposition rate, the suppressing step further comprising the steps of:

depositing an enhancement agent having an enhanced incubation time on some of the surfaces of the formations to reduce the incubation time of the filling material deposition on these surfaces;

wherein the deposition rate of the reactive deposition process fills the formations before the deposition process incubation time passes.

23. The method according to claim 22 further comprising the step of adding a suppressing agent to the reactive deposition process gas to increase the reactive deposition process incubation time to further limit material deposition on the substrate field surface region and the formation sidewalls.

24. The method according to claim 18 wherein said ceasing step comprises automatically flowing a blocking agent layer over the patterned formations when the filling material substantially fills the formations.

25. The method according to claim 24 wherein said flowing step further comprises heating the blocking agent layer to a liquid state, the blocking agent layer having sufficient adhesion and surface tension to maintain its continuity and planarity on the substrate surface, the liquid blocking agent layer flowing over the inlaid deposited material structure surface when the deposited material fills the formation feature and comes into contact with the liquid blocking agent at the borders of the formation feature proximate to the patterned substrate field surface.

* * * * *